(12) United States Patent
Monk et al.

(10) Patent No.: US 12,470,224 B2
(45) Date of Patent: *Nov. 11, 2025

(54) SPUR CANCELLATION FOR SPUR MEASUREMENT

(71) Applicant: Skyworks Solutions, Inc., Irvine, CA (US)

(72) Inventors: Timothy A. Monk, Hudson, NH (US); Rajesh Thirugnanam, Nashua, NH (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/510,215

(22) Filed: Nov. 15, 2023

(65) Prior Publication Data

US 2024/0195423 A1 Jun. 13, 2024

Related U.S. Application Data

(63) Continuation of application No. 17/399,981, filed on Aug. 11, 2021, now Pat. No. 11,855,649, which is a (Continued)

(51) Int. Cl.
*H03L 7/093* (2006.01)
*G01R 29/26* (2006.01)
(Continued)

(52) U.S. Cl.
CPC .............. *H03L 7/093* (2013.01); *G01R 29/26* (2013.01); *G01R 31/31727* (2013.01); *G04F 10/005* (2013.01)

(58) Field of Classification Search
CPC ........ H03L 7/093; G01R 29/26; G04F 10/005
See application file for complete search history.

(56) References Cited

U.S. PATENT DOCUMENTS 3,508,195 A 4/1970 Sellers
4,301,466 A 11/1981 Lemoine et al.
(Continued)

OTHER PUBLICATIONS

Avivi et al., "Adaptive Spur Cancellation Technique in All-Digital Phase-Locked Loops," IEEE Transactions on Circuits and Systems-II: Express Briefs, vol. 64, No. 11, Nov. 2017, pp. 1292-1296.
(Continued)

*Primary Examiner* — Patrick C Chen
(74) *Attorney, Agent, or Firm* — Knobbe, Martens, Olson & Bear, LLP

(57) ABSTRACT

A spur measurement system uses a first device with a spur cancellation circuit that cancel spurs responsive to a frequency control word identifying a spurious tone of interest. A device under test generates a clock signal and supplies the clock signal to the first device through an optional divider. The spur cancellation circuit in the first device generates sine and cosine weights at the spurious tone of interest as part of the spur cancellation process. A first magnitude of the spurious tone in a phase-locked loop in the first device is determined according to the sine and cosine weights and a second magnitude of the spurious tone in the clock signal is determined by the first magnitude divided by gains associated with the first device.

20 Claims, 6 Drawing Sheets

Related U.S. Application Data continuation of application No. 16/018,598, filed on Jun. 26, 2018, now Pat. No. 11,095,295.

(51) Int. Cl.
  *G01R 31/317* (2006.01)
  *G04F 10/00* (2006.01)

(56) References Cited

U.S. PATENT DOCUMENTS

| | | | |
|---|---|---|---|
| 5,467,373 | A | 11/1995 | Ketterling |
| 5,576,666 | A | 11/1996 | Rauvola |
| 6,515,525 | B2 | 2/2003 | Hasegawa |
| 6,829,318 | B2 | 12/2004 | Kawahara |
| 7,061,276 | B2 | 6/2006 | Xu |
| 7,064,616 | B2 | 6/2006 | Reichert |
| 7,208,990 | B1 | 4/2007 | Hassun |
| 7,391,839 | B2 | 6/2008 | Thompson |
| 7,545,190 | B2 | 6/2009 | Chiang et al. |
| 7,605,662 | B2 | 10/2009 | Kobayashi et al. |
| 7,746,972 | B1 | 6/2010 | Melanson et al. |
| 7,888,973 | B1 | 2/2011 | Rezzi |
| 8,207,766 | B2 | 6/2012 | Yu |
| 8,390,348 | B2 | 3/2013 | Burcea |
| 8,427,243 | B2 | 4/2013 | Chen et al. |
| 8,497,716 | B2 | 7/2013 | Zhang |
| 8,604,840 | B2 | 12/2013 | Ahmadi et al. |
| 8,947,139 | B1 | 2/2015 | Vercesi et al. |
| 8,957,712 | B2 | 2/2015 | Tang et al. |
| 9,065,457 | B2 | 6/2015 | Namdar-Mehdiabadi |
| 9,071,195 | B2 | 6/2015 | Gabbay |
| 9,207,646 | B2 | 12/2015 | Wang |
| 9,246,500 | B2 | 1/2016 | Perrott |
| 9,490,818 | B2 | 11/2016 | Perrott |
| 9,634,678 | B1 | 4/2017 | Caffee et al. |
| 9,762,250 | B2 | 9/2017 | Perrott |
| 9,923,563 | B1 | 3/2018 | Horovitz et al. |
| 10,581,418 | B2 | 3/2020 | Wu et al. |
| 10,594,329 | B1 | 3/2020 | Elkholy |
| 10,840,897 | B1 | 11/2020 | Rafi |
| 11,095,295 | B2 | 8/2021 | Monk et al. |
| 11,855,649 | B2 | 12/2023 | Monk et al. |
| 2002/0097826 | A1 | 7/2002 | Iwata et al. |
| 2007/0090866 | A1 | 4/2007 | Park et al. |
| 2008/0061850 | A1 | 3/2008 | Watanabe |
| 2008/0116946 | A1 | 5/2008 | Masson |
| 2008/0129352 | A1 | 6/2008 | Zhang |
| 2008/0218228 | A1 | 9/2008 | Masson |
| 2009/0132884 | A1 | 5/2009 | Suda et al. |
| 2009/0251225 | A1 | 10/2009 | Chen et al. |
| 2010/0061499 | A1 | 3/2010 | Mijuskovik |
| 2010/0097150 | A1 | 4/2010 | Ueda et al. |
| 2010/0213984 | A1 | 8/2010 | Shin et al. |
| 2010/0264963 | A1 | 10/2010 | Kikuchi et al. |
| 2011/0025388 | A1 | 2/2011 | Lamanna |
| 2011/0074479 | A1 | 3/2011 | Yun et al. |
| 2011/0109354 | A1 | 5/2011 | Feng et al. |
| 2011/0109356 | A1 | 5/2011 | Ali et al. |
| 2011/0133799 | A1 | 6/2011 | Dunworth et al. |
| 2011/0204938 | A1 | 8/2011 | Lamanna |
| 2011/0204948 | A1 | 8/2011 | Satoh et al. |
| 2011/0234272 | A1 | 9/2011 | Yu |
| 2012/0153999 | A1 | 6/2012 | Kim |
| 2012/0161832 | A1 | 6/2012 | Lee et al. |
| 2013/0050013 | A1 | 2/2013 | Kobayashi et al. |
| 2013/0112472 | A1* | 5/2013 | Welland ............... H03L 7/18 29/829 |
| 2013/0222026 | A1 | 8/2013 | Havens |
| 2013/0257494 | A1* | 10/2013 | Nikaeen ............... H03L 7/085 327/156 |
| 2014/0077849 | A1 | 3/2014 | Chen et al. |
| 2014/0211899 | A1 | 7/2014 | Furudate |
| 2014/0266341 | A1 | 9/2014 | Jang et al. |
| 2014/0268936 | A1 | 9/2014 | Lu |
| 2015/0008961 | A1 | 1/2015 | Kim et al. |
| 2015/0145567 | A1* | 5/2015 | Perrott ............... H03M 1/0854 327/156 |
| 2015/0145571 | A1 | 5/2015 | Perrott |
| 2015/0207514 | A1 | 7/2015 | Kim et al. |
| 2016/0112053 | A1 | 4/2016 | Perrott |
| 2016/0359493 | A1 | 12/2016 | Chen et al. |
| 2019/0068205 | A1 | 2/2019 | Tamura et al. |

OTHER PUBLICATIONS

Gupta et al., "A1 .8GHz Spur Cancelled Fractional-N Frequency Synthesizer with LMS Based DAC Gain Calibration," IEEE International Solid-State Circuits Conference, vol. 41, No. 12, Dec. 2006, pp. 2842-2851.

Hedayati et al., "A 1 MHz Bandwidth, 6 GHz 0.18 μm CMOS Type-I ΔΣ Franctional-N Synthesizer for WiMAX Applications," IEEE Journal of Solid State Circuits, vol. 44, No. 12, Dec. 2009, pp. 3244-3252.

Hedayati et al., "A 3GHz Wideband ΔΣ Fractional-N Synthesizer with Voltage-Mode Exponential CP-PFD", IEEE Radio Frequency Integrated Circuits Symposium, 2009, pp. 32-328.

Ho et al., "A Fractional-N DPLL With Calibration-Free Multi-Phase Injection-Locked TDC and AdaptiveSingle-Tone Spur Cancellation Scheme," IEEE Transactions on Circuits and Systems-K: Regular Papers, vol. 63, No. 8, Aug. 2016, pp. 1111-1122.

Hsu et al., "A Low-Noise Wide-BW 3.6-GHz Digital ΔΣ Fractional-N Frequency Synthesizer with a Noise-Shaping Time-to-Digital Converter and quantization Noise Cancellation," IEEE Journal of Solid-State Circuits, vol. 43, No. 12, Dec. 2008, pp. 2776-2786.

IDT, "I2C Programmable Ethernet Clock Generator," 8T49N4811 Data Sheet, Revision A, Mar. 30, 2015, pp. 1-34.

Inti et al., "A 0.5-to-2.5 GB/s Reference-Less Half-Rate Digital CDR with Unlimited Frequency Acquisition Range and Improved Input Duty-Cycle Error Tolerance," IEEE Journal of Solid-State Circuits, vol. 46, No. 12, Dec. 2011, pp. 3150-3162.

Li et al., "On-Chip Spur and Phase Noise Cancellation Techniques," IEEE Asian Solid-State Circuits Conference, Nov. 6-8, 2017, pp. 109-112.

Ma, "Feasibility Study of Frequency Doubling Using an ANXOR-Gate Method," MSc. Thesis, Jan. 2013, pp. 1-77.

Menninger et al., "A 1-MHz Bandwidth 3.6-GHz 0.18μm CMOS Fractional-N Synthesizer Utilizing a Hybrid PFD/ DAC Structure for Reduced Broadband Phase Noise," IEEE Journal of Solid-State Circuits, vol. 41, No. 4, Apr. 2006, pp. 966-980.

Oortgiesen R., "Feasibility Study of Frequency Doubling Using a Dual-Edge Method," MSc. Thesis, Nov. 2010, pp. 1-56.

Pamarti et al., "A wideband 2.4GHz Delta-Sigma Fractional-N PLL with 1 Mb/s In-Loop Modulation," IEEE Journal of Solid-State Circuits, vol. 39, No. 1, Jan. 2004, pp. 49-62.

Razavi, "RF Microelectronics," Second Edition, Prentice Hall, 2012, pp. 664-667.

Staszewski et al., "All-Digital PLL and Transmitter for Mobile Phones," IEEE Journal of Solid-State Circuits, vol. 40, No. 12, Dec. 2005, pp. 2469-2482.

Staszewski et al., "1.3 V, 20 ps Time-to-Digital Converter for Frequency Synthesis in 90-nm CMOS," IEEE Transactions on Circuits and Systems-II, Express Briefs, vol. 53, No. 3, Mar. 2006, pp. 220-224.

Straayer et al., A 12-Bit, 10-MHz Bandwidth, Continuous-Time ΔΣ ADC With a 5-Bit, 950-MS/s VCO-Based Quantizer, IEEE Journal of Solid-State Circuits, vol. 43, No. 4, Apr. 2008, pp. 805-814.

Swaminathan et al., "A Wide-Bandwidth 2.4 GHz ISM Band Fractional-N PLL with Adaptive Phase Noise Cancellation", IEEE Journal of Solid-State Circuits, vol. 42, No. 12, Dec. 2007, pp. 2639-2650.

Temporiti E. et al., "A 700kHz Bandwidth ΔΣ Fractional Synthesizer with Spurs Compensation andLinearization Techniques for WCDMA Applications," IEEE Journal of Solid-State Circuits, vol. 39, No. 9, Sep. 2004, pp. 1446-1454.

Wikipedia, "Phase-Locked Loop," https://en.wikipedia.org/wiki/Phase-locked_loop, downloaded Dec. 14, 2015, 17 pages.

(56) References Cited

OTHER PUBLICATIONS

U.S. Appl. No. 16/143,711, entitled "Spur Canceller with Multiplier Less Correlator," filed Sep. 27, 2018, by Timothy A. Monk and Rajesh Thirugnanam.
U.S. Appl. No. 16/143,717, entitled "Spur Cancellation with Adaptive Frequency Tracking," filed Sep. 27, 2018, by Timothy A. Monk and Rajesh Thirugnanam.
U.S. Appl. No. 16/593,473, entitled "Spur Cancellation in a PLL System with an Automatically Updated Target Spur Frequency," filed Oct. 4, 2019, by Timothy A. Monk and Douglas F. Pastorello.
U.S. Appl. No. 16/805,336, entitled "Spur and Quantization Noise Cancellation for PLLS with Non-Linear Phase Detection," filed Feb. 28, 2020, by Aslamali A. Rafi et al.

\* cited by examiner

SPUR CANCELLATION FOR SPUR MEASUREMENT

INCORPORATION BY REFERENCE TO ANY PRIORITY APPLICATIONS

Any and all applications for which a foreign or domestic priority claim is identified in the Application Data Sheet as filed with the present application are hereby incorporated by reference herein and made a part of the present disclosure under 37 CFR 1.57.

BACKGROUND

Field of the Invention

This application relates to measurement of spurious tones.

Description of the Related Art

Signals generated by phase-locked loops and other timing circuits can include undesirable spurious tones. Accurately identifying the existence of spurious tones in a testing environment can help ensure that the parts being supplied do not generate significant spurious tones at frequencies of interest. Accordingly, improved measurement techniques for spurious tones are desirable.

SUMMARY OF EMBODIMENTS OF THE INVENTION

A first device is supplied with a first frequency control word identifying a first frequency corresponding to a spurious tone of interest to be measured in a first signal generated by a device under test. A phase-locked loop (PLL) of the first device generates a second signal based on the first signal. Presence of the spurious tone in the second signal is determined using a spur cancellation circuit in the first device.

In another embodiment a spur measurement system includes a first device having a spur cancellation circuit responsive to a frequency control word identifying a spurious tone of interest to be measured in a first signal received by the first device. The spur cancellation circuit is configured to cancel the spurious tone in a second signal in the first device, the second signal based on the first signal. A storage location in the first device stores information generated in the spur cancellation circuit and used to cancel the spurious tone. A first magnitude of the spurious tone in the second signal is determined according to the information and a second magnitude of the spurious tone in the first signal is determined by the first magnitude divided by gains associated with the first device.

In another embodiment a method includes supplying a first device with a frequency control word identifying a frequency corresponding to a spurious tone of interest to be measured in a first signal. The method further includes generating the first signal in a device under test and generating a second signal in a phase-locked loop of the first device, the second signal based in part on the first signal. Presence of the spurious tone in the first signal is determined based on a spur cancellation circuit in the first device canceling the spurious tone in the second signal. A first magnitude of the spurious tone is determined in the second signal and a second magnitude of the spurious tone in the first signal is determined based on the first magnitude divided by gains associated with the first device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments described herein relate to a spur, or tone, cancellation system or circuit such as one incorporated in a high-performance fractional-N highly-digital phase-locked loop (PLL). One such PLL is described in U.S. Pat. No. 9,762,250, entitled "Cancellation of Spurious Tones Within A Phase-Locked Loop With A Time-To-Digital Converter", filed Jul. 31, 2014, naming Michael H. Perrott as inventor, which application is incorporated herein by reference. The spurious tone cancellation system in one device can be used to detect spurious tones in other devices in a lab or production test environment.

Figure 1:
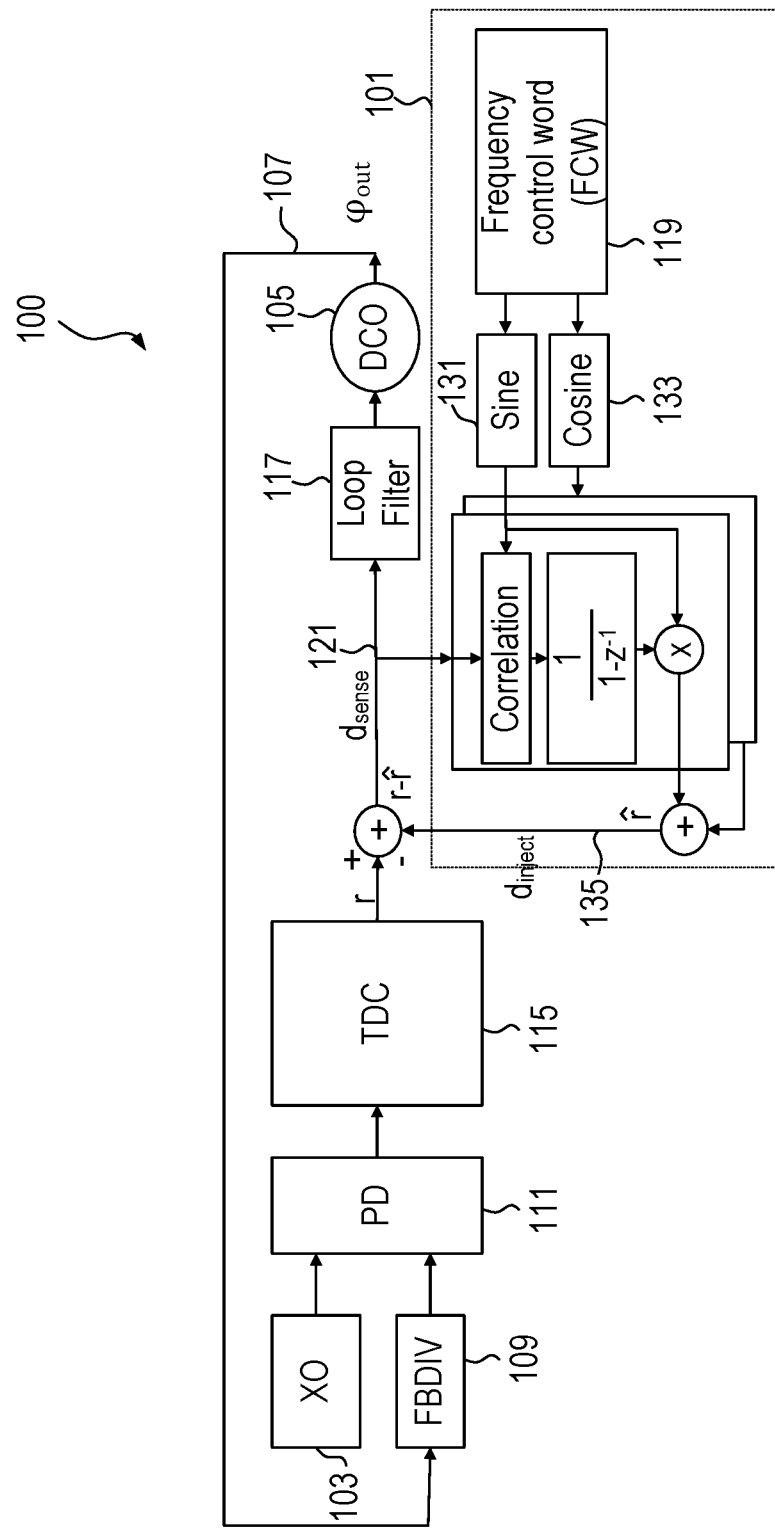
FIG. 1 illustrates a high level block diagram of a PLL with a spur cancellation circuit.

FIG. 1 illustrates a high level block diagram of an embodiment of a PLL 100 with a spur cancellation circuit 101. The PLL 100 receives a reference clock signal from crystal oscillator (XO) 103. A digitally controlled oscillator (DCO) 105 supplies an output signal 107, which is fed back through feedback divider 109 to the phase detector 111. The phase detector supplies a time to digital converter circuit 115, which supplies a signal r that has a spurious tone (spur) canceled before being supplied to loop filter 117.

The spur cancellation circuit receives a programmable frequency control word (FCW) 119 that identifies the spur of interest to be cancelled. In the spur cancellation circuit 101, sine and cosine terms 131 and 133 at the programmable frequency are correlated against a sense node, $d_{sense}$, 121 inside the PLL. The resulting error signals drive a pair of accumulators, which set the weights on the sine and cosine signals, producing a spur cancellation signal, $d_{inject}$ 135. Negative feedback drives the amplitude and phase of the cancellation signal to be such that no spur appears (or the spur is significantly reduced) in the PLL output signal 107.

Figure 2:
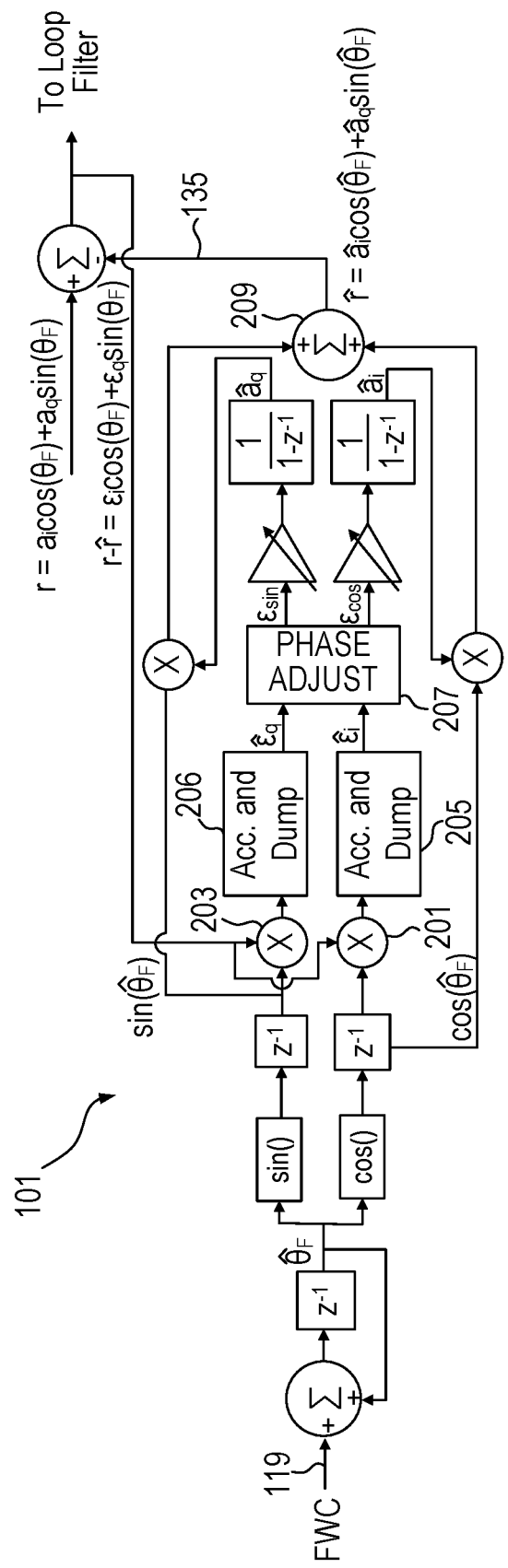
FIG. 2 illustrates additional details of an embodiment of a spur cancellation circuit.

FIG. 2 illustrates an embodiment of the spur cancellation circuit 101 in more detail. In the embodiment of FIG. 2, the two correlators are each implemented with a high-resolution multiplier 201 and 203 and accumulate-and-dump circuits 205 and 206. A phase adjust block 207 follows the accumulate and dump circuits to compensate for PLL dynamics. The final weights on the sine and cosine terms are $â_q$ and $â_i$, which are the scale factors for the sine and cosine components of the cancellation signal. The weights multiply the sine and cosine terms (sin $\hat{\theta}_F$ and cos $\hat{\theta}_F$) and summer 209 sums together the multiplication results and supplies as the spur cancellation signal $d_{inject}$ ($\hat{r}$ in FIG. 2) to cancel the spurious tone at the frequency specified by FWC.

Figure 3:
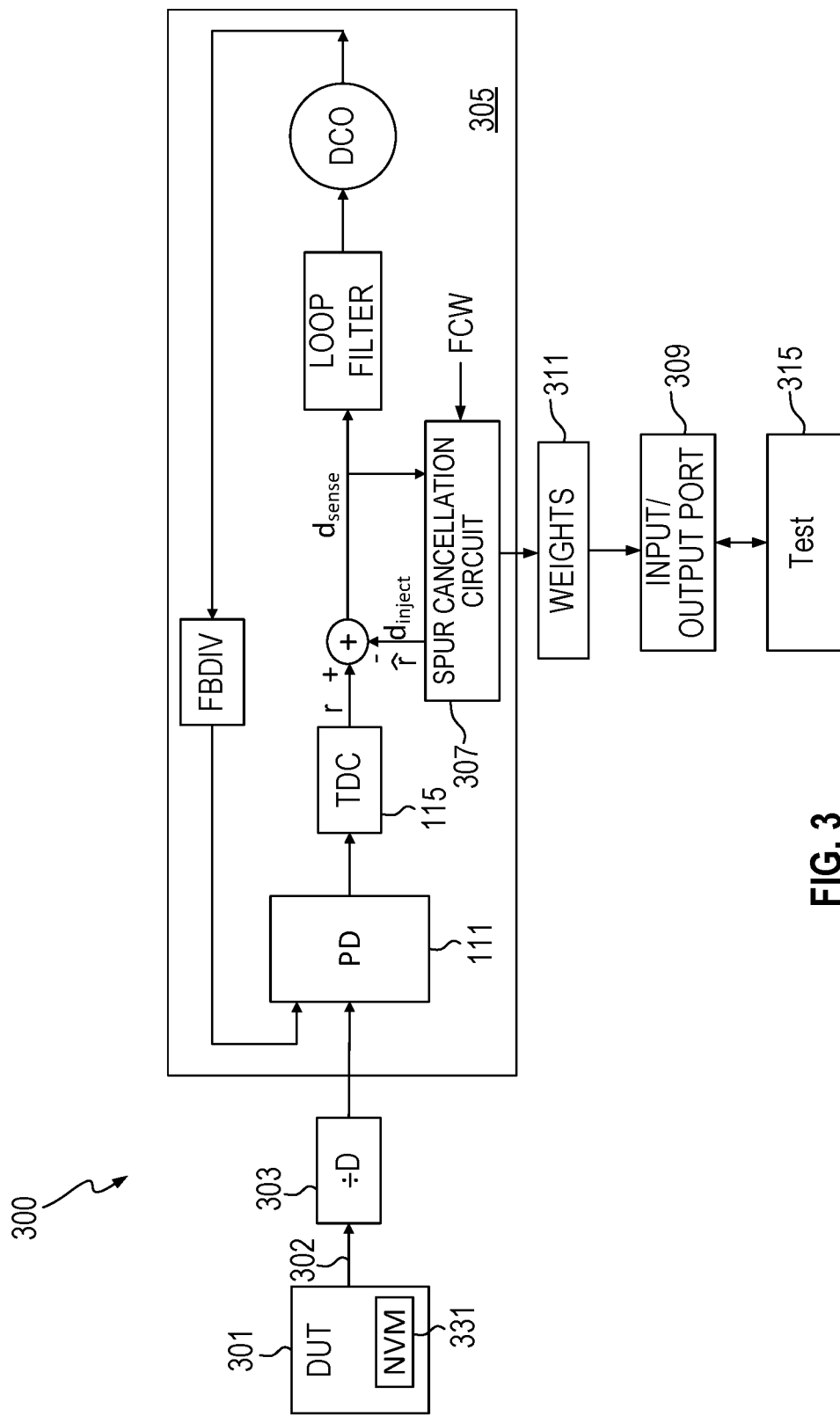
FIG. 3 illustrates an embodiment of a spur measurement system that uses a PLL with a spur cancellation circuit.

While the spur cancellation circuit shown in FIGS. 1 and 2 can be used to cancel spurs in a clock generation system, the spur cancellation circuits can also be used as part of a spur measurement system and used, e.g., in a production test environment. FIG. 3 illustrates an embodiment of a spur measurement system 300 to measure spurs in a signal generated by a device under test (DUT) 301. DUT 301 generates an output clock signal 302 that goes through an optional divider 303, which divides the output frequency by D to be within the valid reference frequency of the PLL 305. PLL 305 incorporates a spur cancellation circuit 307. The spur cancellation circuit operates in sequence targeting a list of possible spur frequencies supplied as FCWs. The list of possible spur frequencies can be provided over input/output port 309 from a test apparatus 315. The input/output port 309 may be implemented, e.g., as a serial interface. The spur frequencies specified in the FCWs can also be scanned in if a scan interface is available.

For each spur frequency of interest, the spur cancellation circuit generates sine and cosine weights. If there is no spur at the frequency of interest, the sine and cosine weights reflect the lack of a spur present at the frequency of interest by being approximately 0. If there is a spur at the frequency of interest, the existence of the spur will be confirmed based on the magnitude of the spur on the internal PLL signal r supplied by TDC 115. The spur sine and cosine weights associated with each FCW may be stored in storage 311. The storage 311 may be in locations separate from the spur cancellation circuit 307 or storage such as registers, flip-flops, or latches within the spur cancellation circuit 307. The spur amplitudes can be computed conventionally by taking the sine and cosine weights kept in storage 311 and converting the sine and cosine weights to the corresponding magnitude and phase representation. The conversion to magnitude and phase may be accomplished using $(x^2+y^2)^{1/2}$ and $\tan^{-1}(y/x)$, where x is $\hat{\alpha}_i$ and y is $\hat{\alpha}_q$. Other embodiments can calculate the spur magnitude and phase in different ways depending on the specific implementation of the spur cancellation circuit. The magnitude and phase calculation can be done either on the integrated circuit with the PLL 305, e.g., if a microcontroller is available on chip, or off chip by accessing the weights storage 311 through the input/output port 309 and computing the amplitude in the test apparatus 315. In an embodiment, the spur on the DUT clock signal 302 can be determined based on the spur magnitude (determined using the sine and cosine weights) on the internal PLL signal r divided by the gains of the phase detector 111 and TDC 115 in the PLL. The gains associated with phase detector 111 and TDC 115 can be measured empirically or through simulation.

Figure 4:
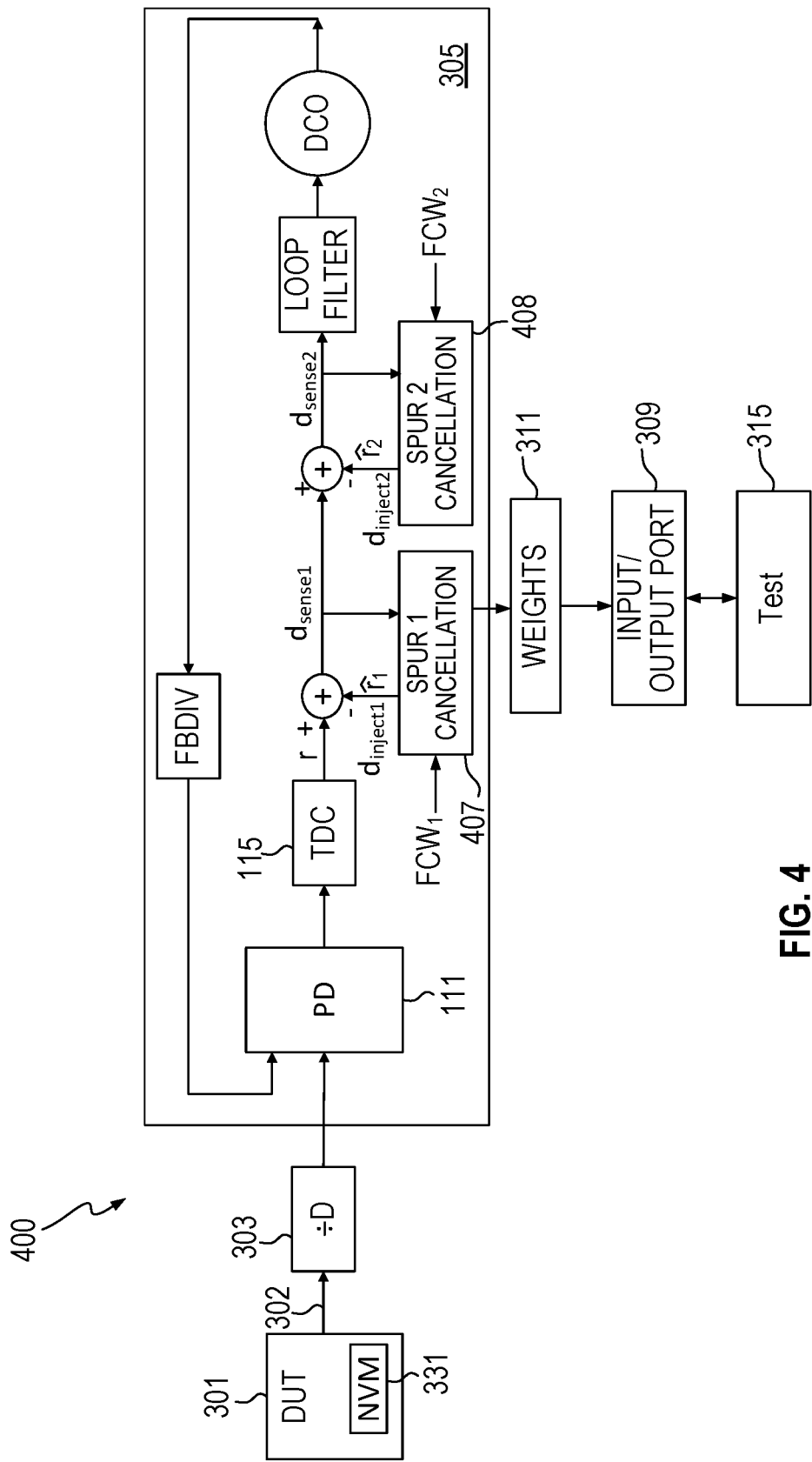
FIG. 4 illustrates an embodiment of a spur measurement system that uses a PLL with multiple spur cancellation circuits.

Referring to FIG. 4, the speed of spur measurement can be improved by using multiple spur cancellation circuits 407 and 408 in spur measurement system 400. The multiple spur cancellation circuits can operate independently, while having only one PLL. In FIG. 4, the spur cancellation circuits 407 and 408 receive different spur frequencies (FCW1 and FCW2) to cancel. Thus, more than one spur can be targeted and measured at a time thereby allowing a list of possible spur frequencies to be processed faster with less hardware. In embodiments, the multiple spur cancellation circuits may be time interleaved. While two spur cancellation circuits are shown, additional spur cancellation circuits may be used.

Figure 5:
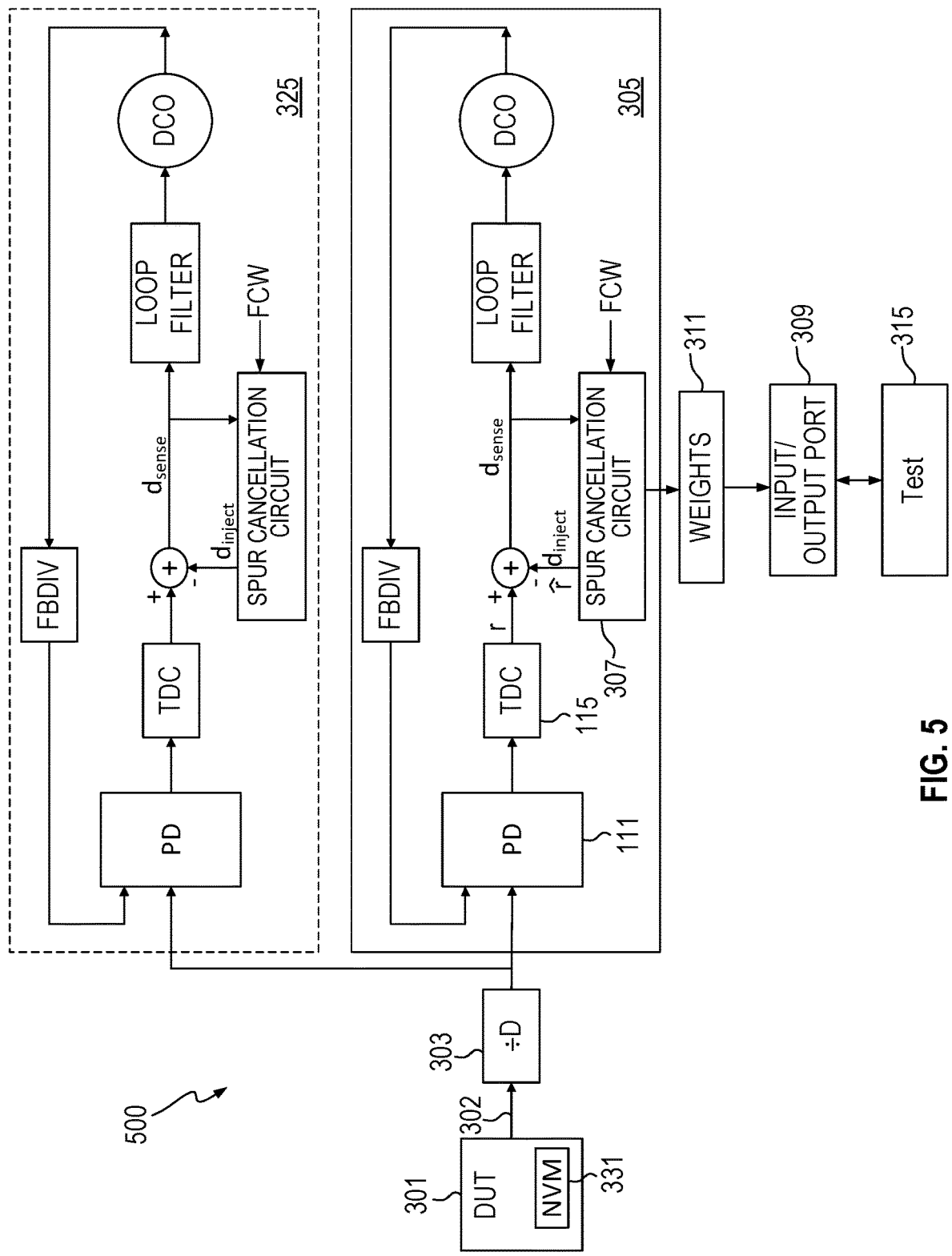
FIG. 5 illustrates an embodiment of a spur measurement system that uses multiple PLLs.

Referring to FIG. 5, embodiments may utilize multiple PLLs, e.g., PLLs 305 and 325 in a spur measurement system 500, each with one or more spur cancellation circuits. Note that the weights storage and I/O port associated with PLL 325 were omitted for ease of illustration.

Once the spurs of interest have been measured to determine if they exist in the output clock signal 302 of DUT 301, the presence or absence of a spur above a specified level acts as a test instrument readout. The presence or absence of a spur may be used, e.g., to screen or bin parts, or to aide in process control in manufacturing. In addition, embodiments may store results of the spur testing in the DUT itself in NVM 331. The information may include, e.g., the frequencies of the spurs tested and the results of the testing.

Figure 6:
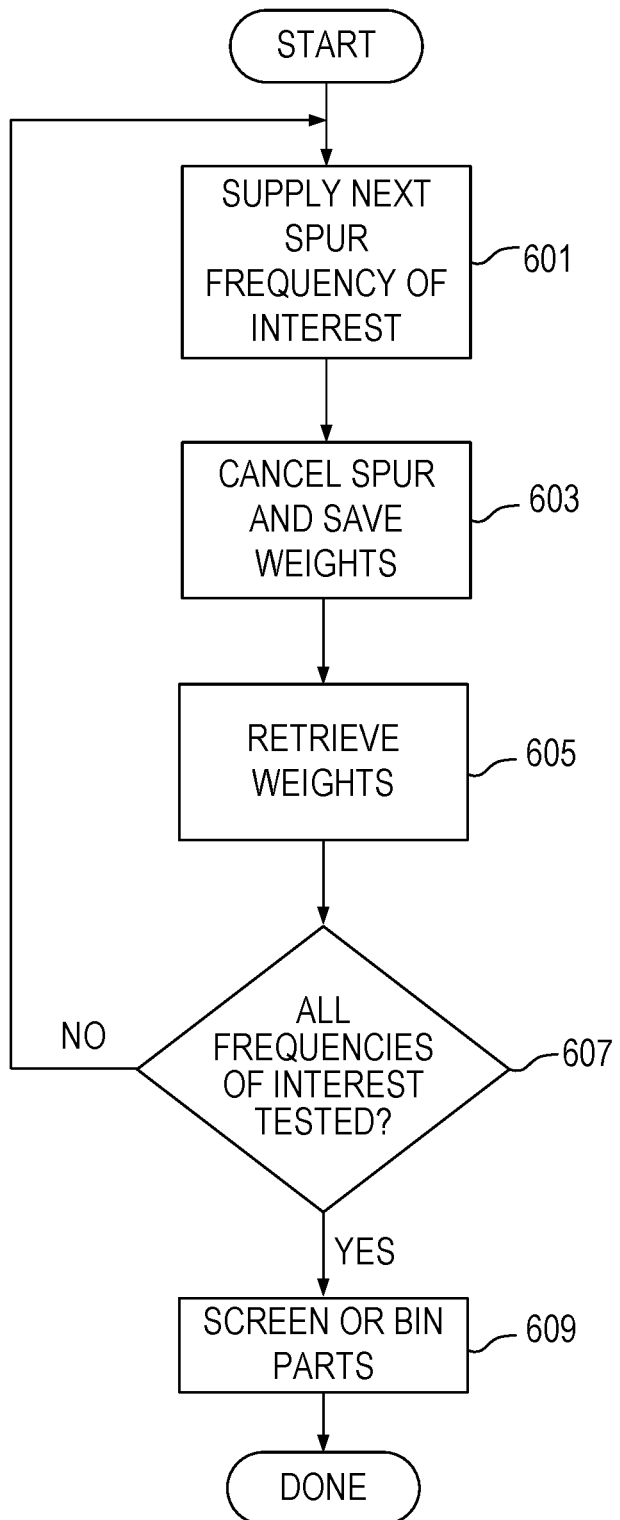
FIG. 6 illustrates an example flow diagram of operation of a spur measurement system.

FIG. 6 illustrates a flow chart illustrating an embodiment of operation of the spur measurement system 300, 400, or 500 illustrated in FIGS. 3, 4 and 5. In 601 the tester 315 supplies a spur frequency of interest (the FCW) through the I/O port 309. The DUT 301 supplies the output clock signal 302 through optional divider 303 to the PLL 305. In 603 the PLL 305 cancels any spurs present at the frequency of interest and stores the sine and cosine weights associated with the spur cancellation in weights storage 311. Note that storing the weights may simply be part of the process of the cancellation and not a separate action on the part of the spur cancellation circuit. At 605 the test apparatus 315 retrieves the weights and determines the magnitude of the spur at the frequency of interest as described above. If all the frequencies of interest have not been tested in 607, the test apparatus returns to 601 and supplies a next spur frequency of interest. If all the frequencies of interest have been tested, in 609 the spur test results can be used to screen or bin parts. Note that many variations of the flow diagram of FIG. 6 are possible. For example, the tester may supply multiple FCWs at one time and the PLL 305 cycles through the various FCWs. The PLL 305 may store all the weights for all the tests in memory 311 and the tester only retrieves the weights and makes magnitude calculations at the end of the testing. The tester may test the DUT using multiple PLLs or multiple spur cancellation circuits with one PLL for greater efficiency.

Thus, various aspects have been described relating to spur measurement. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method of determining a presence of a spurious tone in a device-under-test clock signal, the method comprising:
   receiving an indication of a first frequency corresponding to a spurious tone to be measured in the device-under-test clock signal;
   generating a phase-locked loop signal in a phase-locked loop based on the device-under-test clock signal and a feedback signal;
   with a spur cancellation circuit, generating an error signal based on the phase-locked loop signal;
   determining a first magnitude of the spurious tone in the phase-locked loop signal based on the error signal and one or more weights of a spur cancellation signal; and
   determining a second magnitude of the spurious tone in the device-under-test clock signal based on the first magnitude and a plurality of gain factors of the phase-locked loop.

2. The method of claim 1 wherein the plurality of gain factors include a first gain associated with a phase detector.

3. The method of claim 2 wherein the plurality of gain factors further include a second gain associated with a time-to-digital converter.

4. The method of claim 1 wherein the indication of the first frequency includes a frequency control word.

5. The method of claim 1 further comprising:
generating the phase-locked loop signal in a time-to-digital converter in the phase-locked loop; and
controlling an oscillator of the phase-locked loop using the phase-locked loop signal.

6. The method of claim 1 wherein the phase-locked loop signal is generated in the phase-locked loop based on the feedback signal and a divided version of the device-under-test clock signal.

7. The method of claim 1 further comprising storing the one or more weights in memory.

8. The method of claim 1 further comprising receiving a second indication of a second frequency corresponding to an additional spurious tone to be measured in the device-under-test clock signal.

9. A spur measurement system comprising:
a phase-locked loop responsive to an indication of a spurious tone in a device-under-test clock signal, the phase-locked loop configured to determine a presence of the spurious tone in a phase-locked loop signal generated based on the device-under-test clock signal and a feedback signal, to generate an error signal based on the phase-locked loop signal, to determine a first magnitude of the spurious tone in the phase-locked loop signal based on the error signal and one or more weights of a spur cancellation signal, and to determine a second magnitude of the spurious tone in the device-under-test clock signal based on the first magnitude and a plurality of gain factors of the phase-locked loop.

10. The system of claim 9 wherein the plurality of gain factors include a first gain associated with a phase detector.

11. The system of claim 10 wherein the plurality of gain factors further include a second gain associated with a time-to-digital converter.

12. The system of claim 9 wherein the phase-locked loop further includes an oscillator and a time-to-digital converter, the time-to-digital converter configured to generate the phase-locked loop signal, the phase-locked loop configured to control the oscillator using the phase-locked loop signal.

13. The system of claim 9 wherein the indication of the spurious tone includes a frequency control word.

14. The system of claim 9 wherein the phase-locked loop is further configured to generate the phase-locked loop signal based on the feedback signal and a divided version of the device-under-test clock signal.

15. The system of claim 9 further comprising memory in which the one or more weights are stored.

16. A spur measurement system comprising:
a first phase-locked loop configured to receive a device-under-test clock signal, the first phase-locked loop including a first spur cancellation circuit configured to cancel a first spurious tone in a first phase-locked loop signal generated based on the device-under-test clock signal and a feedback signal, the first spur cancellation circuit further configured to generate a first error signal based on the first phase-locked loop signal, to determine a first magnitude of the first spurious tone in the first phase-locked loop signal based on the first error signal and one or more weights of a spur cancellation signal, and to determine a second magnitude of the first spurious tone in the device-under-test clock signal based on the first magnitude and a plurality of gain factors of the first phase-locked loop; and
a second phase-locked loop configured to receive the device-under-test clock signal, the first phase-locked loop including a second spur cancellation circuit configured to cancel a second spurious tone in a second phase-locked loop signal generated based on the device-under-test clock signal, the second spur cancellation circuit further configured to generate a second error signal based on the second phase-locked loop signal, to determine a third magnitude of the second spurious tone in the second phase-locked loop signal based on the second error signal and one or more weights of a spur cancellation signal, and to determine a fourth magnitude of the second spurious tone in the device-under-test clock signal based on the third magnitude and a plurality of gain factors of the second phase-locked loop.

17. The system of claim 16 wherein the plurality of gain factors of the first phase-locked loop include a first gain associated with a phase detector of the first phase-locked loop, and the plurality of gain factors of the second phase-locked loop include a first gain associated with a phase detector of the second phase-locked loop.

18. The system of claim 17 wherein the plurality of gain factors of the first phase-locked loop further include a second gain associated with a time-to-digital converter of the first phase-locked loop, and the plurality of gain factors of the second phase-locked loop further include a second gain associated with a time-to-digital converter of the second phase-locked loop.

19. The system of claim 16 wherein the first spur cancellation circuit is configured to receive a first frequency control word indicating the first spurious tone and the second spur cancellation circuit is configured to receive a second frequency control word indicating the second spurious tone.

20. The system of claim 16 wherein the first phase-locked loop is further configured to generate the first phase-locked loop signal based on the feedback signal and a divided version of the device-under-test clock signal.

* * * * *